US012692623B2

(12) United States Patent
Minami et al.

(10) Patent No.: US 12,692,623 B2
(45) Date of Patent: Jul. 28, 2026

(54) METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: Kokusai Electric Corporation, Tokyo (JP)

(72) Inventors: Kaichiro Minami, Toyama (JP); Naonori Akae, Toyama (JP); Akito Hirano, Toyama (JP); Sadayasu Suyama, Toyama (JP); Takayuki Yamamoto, Toyama (JP); Shunsuke Asakura, Toyama (JP); Yugo Orihashi, Toyama (JP); Yasuhiro Megawa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 807 days.

(21) Appl. No.: 17/945,550

(22) Filed: Sep. 15, 2022

(65) Prior Publication Data

US 2023/0295837 A1 Sep. 21, 2023

(30) Foreign Application Priority Data

Mar. 18, 2022 (JP) ................................ 2022-044079

(51) Int. Cl.
| | |
|---|---|
| *C30B 25/18* | (2006.01) |
| *C30B 25/16* | (2006.01) |
| *H10P 14/20* | (2026.01) |

(52) U.S. Cl.
CPC ............ *C30B 25/186* (2013.01); *C30B 25/16* (2013.01); *H10P 14/3602* (2026.01); *H10P 14/20* (2026.01); *H10P 14/3411* (2026.01)

(58) Field of Classification Search
CPC ....... C30B 25/186; C30B 25/16; H10P 14/20; H10P 14/311; H10P 14/3602;
(Continued)

(56) References Cited

U.S. PATENT DOCUMENTS 11,189,498 B2 * 11/2021 Orii ................... H01L 21/67069
11,342,192 B2 * 5/2022 Takahashi ........... H01L 21/3065
(Continued)

FOREIGN PATENT DOCUMENTS

| | | |
|---|---|---|
| JP | 2008-235315 A | 10/2008 |
| JP | 2015-008199 A | 1/2015 |
| | (Continued) | |

OTHER PUBLICATIONS

Korean Office Action issued on Jun. 27, 2024 for Korean Patent Application No. 10-2022-0115781.
(Continued)

*Primary Examiner* — Brian K Talbot
(74) *Attorney, Agent, or Firm* — Volpe Koenig

(57) ABSTRACT

There is provided a technique that includes: (a) forming a modified layer by modifying at least a portion of an oxide film of a substrate by performing, a predetermined number of times: (a1) supplying a fluorine-containing gas to the substrate including the oxide film; and (a2) supplying a first reducing gas to the substrate; and (b) supplying the fluorine-containing gas to the substrate after the modified layer is formed.

19 Claims, 6 Drawing Sheets

(58) Field of Classification Search
CPC ......... H01L 21/02661; H01L 21/02532; H01L 21/02634
USPC .................................................. 427/255.17
See application file for complete search history.

(56) References Cited

U.S. PATENT DOCUMENTS

| | | | | |
|---|---|---|---|---|
| 2007/0039924 | A1* | 2/2007 | Dip | H01L 21/02046 |
| | | | | 438/715 |
| 2008/0223400 | A1 | 9/2008 | Onishi et al. | |
| 2015/0187593 | A1 | 7/2015 | Narushima et al. | |
| 2016/0163562 | A1 | 6/2016 | Tozawa et al. | |
| 2017/0087606 | A1 | 3/2017 | Nakamura et al. | |
| 2017/0186604 | A1 | 6/2017 | Orihashi et al. | |
| 2020/0006079 | A1 | 1/2020 | Miyoshi et al. | |
| 2020/0095678 | A1* | 3/2020 | Harada | C23C 16/4405 |
| 2021/0305058 | A1* | 9/2021 | Ogawa | H01L 21/67069 |
| 2021/0358772 | A1 | 11/2021 | Garashi et al. | |
| 2022/0301854 | A1* | 9/2022 | Horita | C23C 16/45523 |

FOREIGN PATENT DOCUMENTS

| | | | |
|---|---|---|---|
| JP | 2015-144249 | A | 8/2015 |
| JP | 2016-119343 | A | 6/2016 |
| JP | 2017-069230 | A | 4/2017 |
| JP | 2017-117977 | A | 6/2017 |
| JP | 2020-004837 | A | 1/2020 |
| JP | 2021-106282 | A | 7/2021 |
| JP | 2021-180281 | A | 11/2021 |
| KR | 10-2008-0084743 | A | 9/2008 |
| KR | 10-2016-0022826 | A | 3/2016 |

OTHER PUBLICATIONS

Japanese Office Action issued May 23, 2023 for Japanese Patent Application No. 2022-044079.

Japanese Office Action issued May 23, 2023 for Japanese Patent Application No. 2020-7022813.

* cited by examiner

Figure 5:
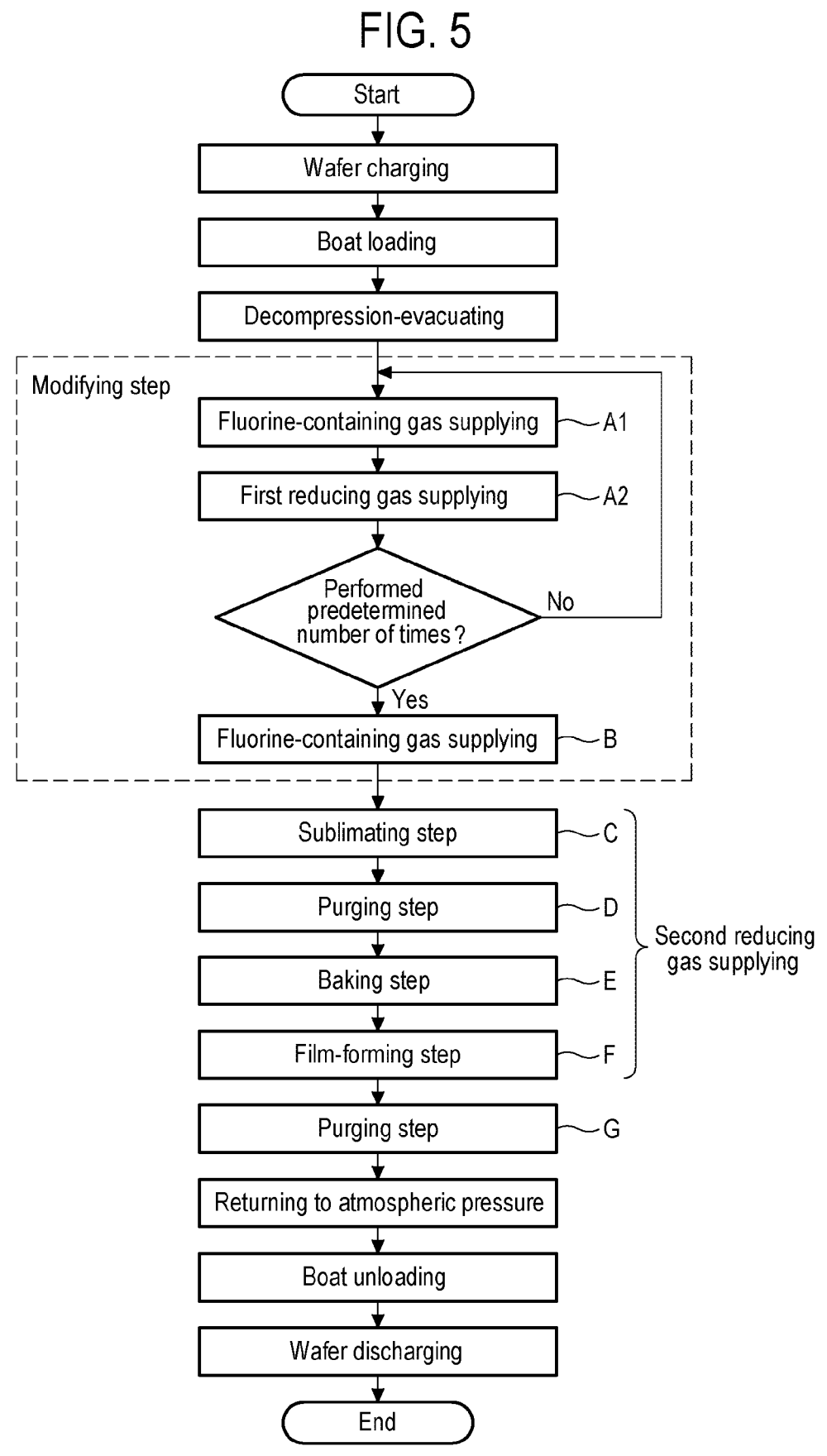

Start

Wafer charging

Boat loading

Decompression-evacuating

Modifying step

Fluorine-containing gas supplying ～A1

First reducing gas supplying ～A2

Performed predetermined number of times? — No

Yes

Fluorine-containing gas supplying ～B

Sublimating step ～C

Purging step ～D     Second reducing gas supplying

Baking step ～E

Film-forming step ～F

Purging step ～G

Returning to atmospheric pressure

Boat unloading

Wafer discharging

End

METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2022-044079, filed on Mar. 18, 2022, the entire contents of which are incorporated herein by reference.

TECHNICAL FIELD

The present disclosure relates to a method of processing a substrate, a method of manufacturing a semiconductor device, a recording medium, and a substrate processing apparatus.

BACKGROUND

In the related art, for example, hydrogen fluoride may be used to remove a native oxide film formed on a surface of a substrate.

However, the native oxide film formed on the surface of the substrate may not be sufficiently removed by using the hydrogen fluoride alone. Therefore, there is a desire for a better method of removing the native oxide film.

SUMMARY

Some embodiments of the present disclosure provide a technique capable of sufficiently removing a native oxide film formed on a surface of a substrate.

According to embodiments of the present disclosure, there is provided a technique that includes: (a) forming a modified layer by modifying at least a portion of an oxide film of a substrate by performing, a predetermined number of times: (a1) supplying a fluorine-containing gas to the substrate including the oxide film; and (a2) supplying a first reducing gas to the substrate; and (b) supplying the fluorine-containing gas to the substrate after the modified layer is formed.

BRIEF DESCRIPTION OF DRAWINGS

The accompanying drawings, which are incorporated in and constitute a part of the specification, illustrate embodiments of the present disclosure.

FIG. 2 is a schematic configuration view of the vertical process furnace of the substrate processing apparatus suitably used in the embodiments of the present disclosure, in which a portion of the process furnace is shown in a cross section taken along line A-A in FIG. 1.

FIG. 5 is a diagram showing a process flow in the embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the Present Disclosure

Embodiments of the present disclosure will now be described mainly with reference to FIGS. 1 to 6. The drawings used in the following description are schematic, and dimensional relationship, ratios, and the like of various elements shown in figures may not match the actual ones. Further, the dimensional relationship, ratios, and the like of various elements among plural figures may not match one other.

(1) Configuration of Substrate Processing Apparatus

Figure 1:
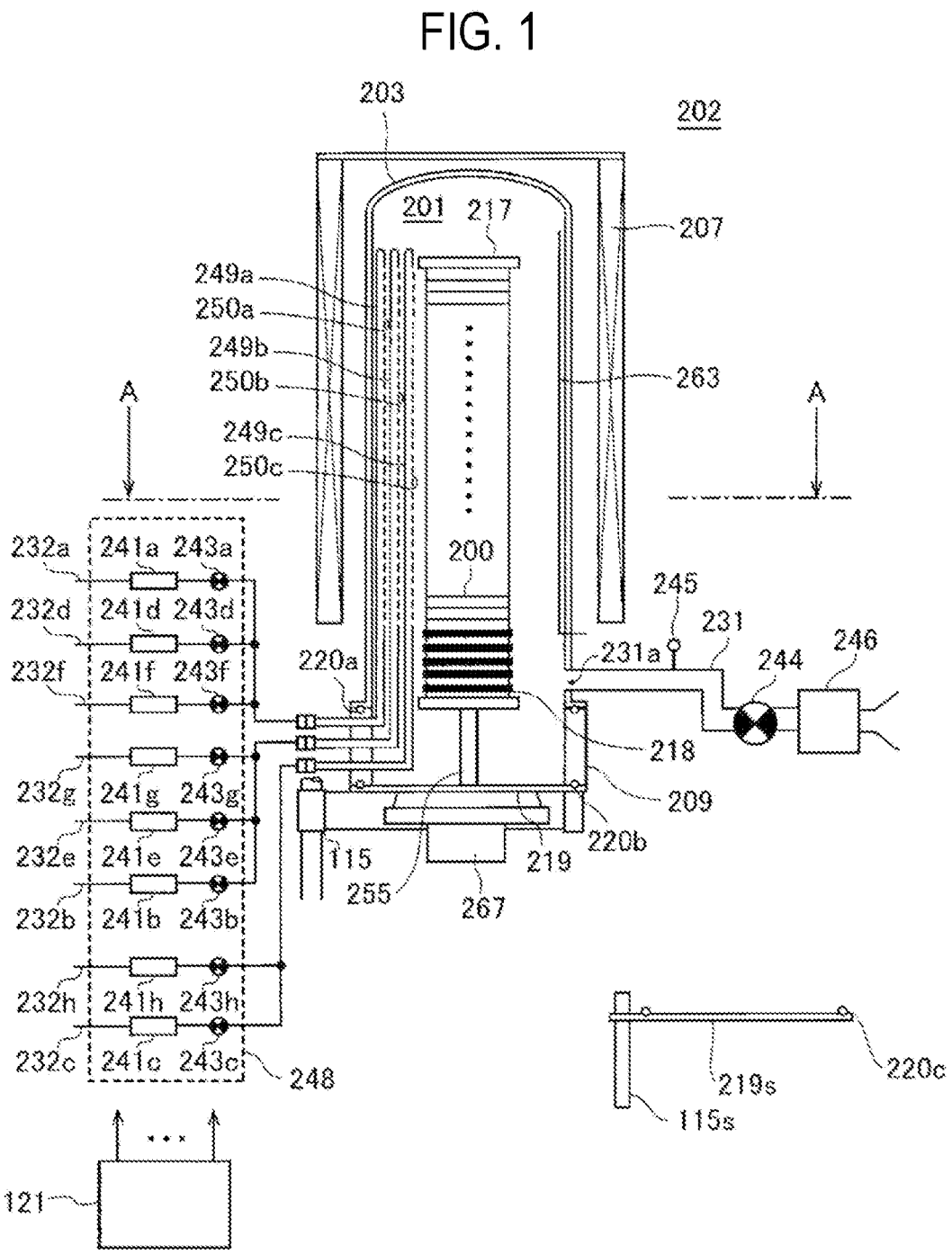
FIG. 1 is a schematic configuration view of a vertical process furnace of a substrate processing apparatus suitably used in embodiments of the present disclosure, in which a portion of the process furnace is shown in a vertical cross section.

As shown in FIG. 1, a process furnace 202 includes a heater 207 as a temperature regulator (a heating part). The heater 207 is formed in a cylindrical shape and is supported by a holding plate to be vertically installed. The heater 207 also functions as an activator (an exciter) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and formed in a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and formed in a cylindrical shape with both of its upper and lower ends opened. The upper end portion of the manifold 209 engages with the lower end portion of the reaction tube 203 to support the reaction tube 203. An O-ring 220a serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. Processing on the wafers 200 is performed in the process chamber 201.

Nozzles 249a to 249c as first to third suppliers are installed in the process chamber 201 to penetrate through a sidewall of the manifold 209. The nozzles 249a to 249c are also referred to as first to third nozzles, respectively. The nozzles 249a to 249c are made of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from the upstream side of gas flow. Each of gas supply pipes 232d and 232f is connected to the gas supply pipe 232a at the downstream side of the valves 243a. Each of gas supply pipes 232e and 232g is connected to the gas supply pipe 232b at the downstream side of the valves 243b. A gas supply pipe 232h is connected to the gas supply pipe 232c at the downstream side of the valves 243c. MFCs 241d to 241h and valves 243d to 243h are installed at the gas supply pipes 232d to 232h, respectively, sequentially from the upstream side of gas flow. The gas supply pipes 232a to 232h are made of, for example, a metal material such as SUS.

Figure 2:
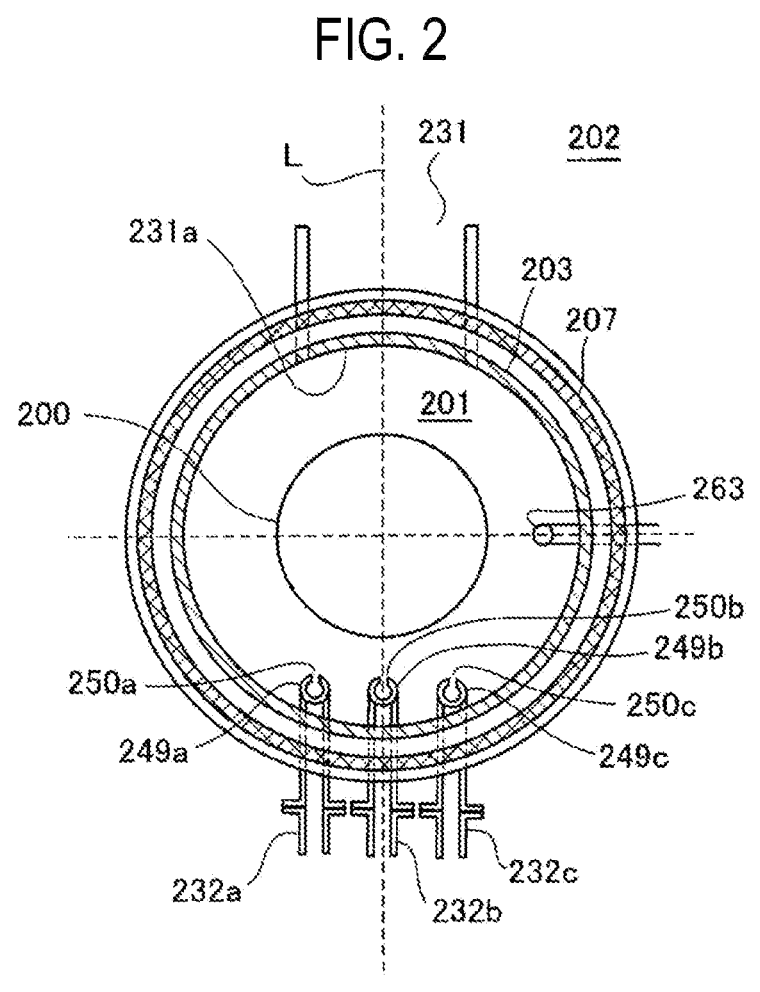

As shown in FIG. 2, each of the nozzles 249a to 249c is installed in an annular space (in a plane view) between an inner wall of the reaction tube 203 and the wafers 200 to extend upward from a lower portion to an upper portion of the inner wall of the reaction tube 203, that is, along an arrangement direction of the wafers 200. Specifically, each of the nozzles 249a to 249c is installed in a region horizontally surrounding a wafer arrangement region in which the wafers 200 are arranged at a lateral side of the wafer arrangement region, along the wafer arrangement region. In the plane view, the nozzle 249b is disposed to face an exhaust port 231a to be described later in a straight line with the centers of the wafers 200 loaded into the process chamber 201, which are interposed therebetween. The nozzles 249a and 249c are arranged to sandwich a straight line L passing through the nozzle 249b and the center of the exhaust port 231a from both sides along the inner wall of the reaction tube 203 (outer peripheral portion of the wafers 200). The straight line L is also a straight line passing through the nozzle 249b and the centers of the wafers 200. That is, it may be said that the nozzle 249c is installed on the side opposite to the nozzle 249a with the straight line L interposed therebetween. The nozzles 249a and 249c are arranged in line symmetry with the straight line L as the axis of symmetry. Gas supply holes 250a to 250c configured to supply a gas are formed on the side surfaces of the nozzles 249a to 249c, respectively. Each of the gas supply holes 250a to 250c is opened as to oppose (face) the exhaust port 231a in the plane view, which enables the gas to be supplied toward the wafers 200. A plurality of gas supply holes 250a to 250c are formed from the lower portion to the upper portion of the reaction tube 203.

A fluorine (F)-containing gas is supplied from the gas supply pipe 232a into the process chamber 201 via the MFC 241a, the valve 243a, and the nozzle 249a. For example, a fluorine (F)- and hydrogen (H)-containing gas may be used as the F-containing gas.

A first reducing gas is supplied from the gas supply pipe 232b into the process chamber 201 via the MFC 241b, the valve 243b, and the nozzle 249b. For example, a nitrogen (N)- and hydrogen (H)-containing gas may be used as the first reducing gas.

A second reducing gas is supplied from the gas supply pipe 232c into the process chamber 201 via the MFC 241c, the valve 243c, and the nozzle 249c. For example, a nitrogen (N)-free hydrogen (H)-containing gas may be used as the second reducing gas.

A first process gas as a precursor gas is supplied from the gas supply pipe 232d into the process chamber 201 via the MFC 241d, the valve 243d, the gas supply pipe 232a, and the nozzle 249a.

A second process gas as a dopant gas is supplied from the gas supply pipe 232e into the process chamber 201 via the MFC 241e, the valve 243e, the gas supply pipe 232b, and the nozzle 249b.

An inert gas is supplied from the gas supply pipes 232f to 232h into the process chamber 201 via the MFCs 241f to 241h, the valves 243f to 243h, the gas supply pipes 232a to 232c, and the nozzles 249a to 249c, respectively. The inert gas acts as a purge gas, a carrier gas, a dilution gas, or the like.

An F-containing gas supply system (F- and H-containing gas supply system) mainly includes the gas supply pipe 232a, the MFC 241a, and the valve 243a. A first reducing gas supply system (N- and H-containing gas supply system) mainly includes the gas supply pipe 232b, the MFC 241b, and the valve 243b. A second reducing gas supply system (N-free and H-containing gas supply system) mainly includes the gas supply pipe 232c, the MFC 241c, and the valve 243c. A first process gas supply system (precursor gas supply system) mainly includes the gas supply pipe 232d, the MFC 241d, and the valve 243d. A second process gas supply system (dopant gas supply system) mainly includes the gas supply pipe 232e, the MFC 241e, and the valve 243e. An inert gas supply system mainly includes the gas supply pipes 232f to 232h, the MFCs 241f to 241h, and the valves 243f to 243h.

One or all of the above-described various supply systems may be configured as an integrated-type supply system 248 in which the valves 243a to 243h, the MFCs 241a to 241h, and so on are integrated. The integrated-type supply system 248 is connected to each of the gas supply pipes 232a to 232h. In addition, the integrated-type supply system 248 is configured such that operations of supplying various materials (various gases) into the gas supply pipes 232a to 232h (that is, the opening/closing operation of the valves 243a to 243h, the flow rate regulation operation by the MFCs 241a to 241h, and the like) are controlled by a controller 121 which will be described later. The integrated-type supply system 248 is configured as an integral type or detachable-type integrated unit, and may be attached to and detached from the gas supply pipes 232a to 232h and the like on an integrated unit basis, such that maintenance, replacement, extension, and the like of the ingrated-type supply system 248 may be performed on an integrated unit basis.

The exhaust port 231a configured to exhaust an internal atmosphere of the process chamber 201 is installed below the sidewall of the reaction tube 203. As shown in FIG. 2, in the plane view, the exhaust port 231a is installed at a position opposing (facing) the nozzles 249a to 249c (the gas supply holes 250a to 250c) with the wafers 200 interposed therebetween. The exhaust port 231a may be installed from a lower portion to an upper portion of the sidewall of the reaction tube 203, that is, along the wafer arrangement region. An exhaust pipe 231 is connected to the exhaust port 231a. A vacuum pump 246 as a vacuum exhauster is connected to the exhaust pipe 231 via a pressure sensor 245, which is a pressure detector (pressure detection part) configured to detect the internal pressure of the process chamber 201, and an auto pressure controller (APC) valve 244, which is a pressure regulator (pressure regulation part). The APC valve 244 is configured to be capable of performing or stopping a vacuum exhausting operation in the process chamber 201 by opening/closing the valve while the vacuum pump 246 is actuated, and is also configured to be capable of regulating the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is installed under the manifold 209. The seal cap 219 is made of, for example, a metal material such as SUS, and is formed in a disc shape. An O-ring 220b, which is a seal making contact with the lower end of the manifold 209, is provided on an upper surface of the seal cap 219. A rotator 267 configured to rotate a boat 217, which will be described later, is installed under the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically move up or down by a boat elevator 115 which is an elevation mechanism installed outside the reaction tube 203. The boat elevator 115 is configured as a transporter (transport mechanism) which loads/unloads (transports) the wafers 200 into/ out of the process chamber 201 by moving the seal cap 219 up or down.

A shutter 219s, which serves as a furnace opening lid configured to be capable of hermetically sealing a lower end opening of the manifold 209 in a state where the seal cap 219 is lowered and the boat 217 is unloaded from the process chamber 201, is installed under the manifold 209. The shutter 219s is made of, for example, a metal material such as SUS, and is formed in a disc shape. An O-ring 220c, which is a seal making contact with the lower end of the manifold 209, is provided on an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution in the process chamber 201 becomes a desired temperature distribution. The temperature sensor 263 is installed along the inner wall of the reaction tube 203.

Figure 3:
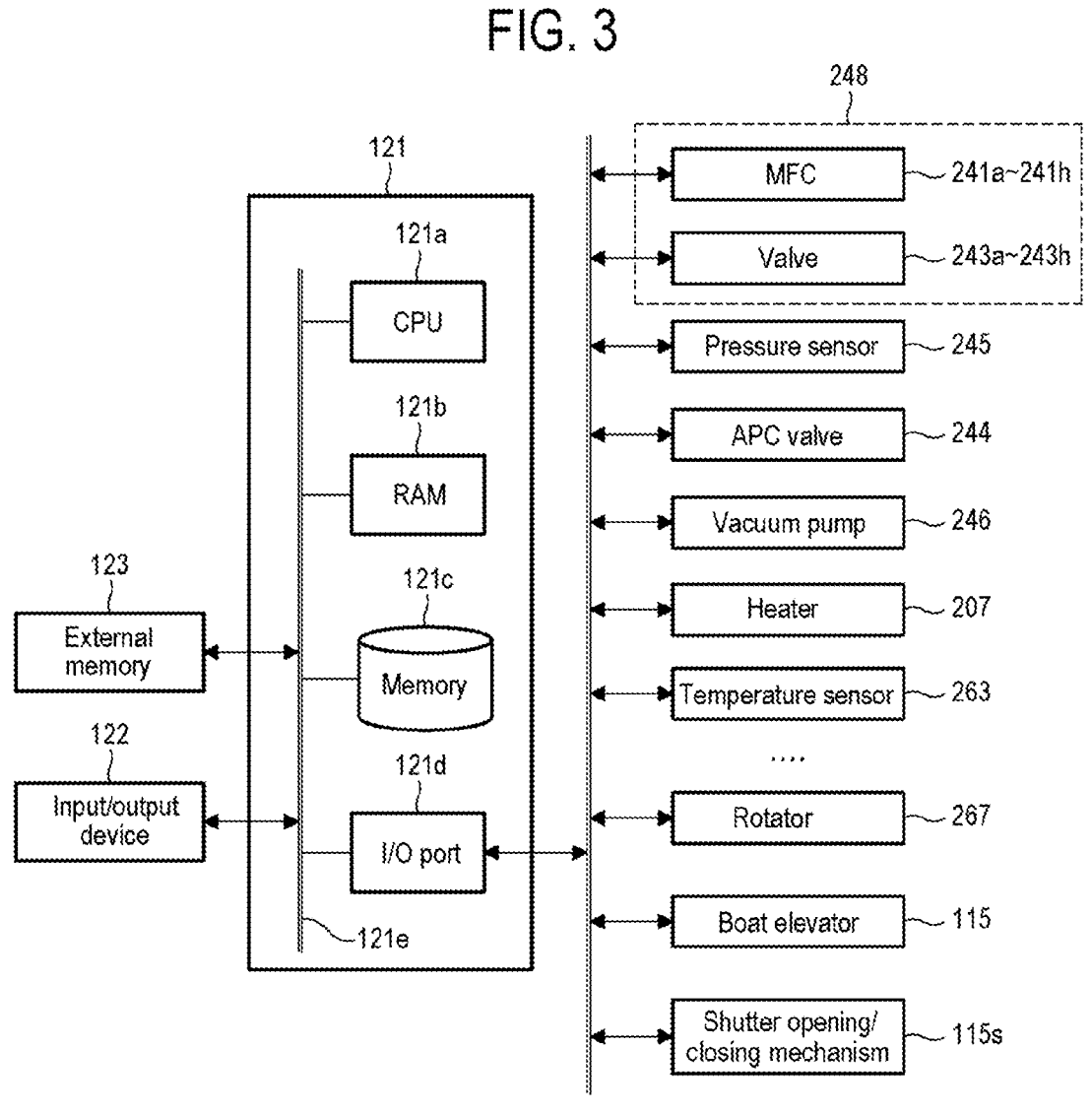
FIG. 3 is a schematic configuration diagram of a controller of the substrate processing apparatus suitably used in the embodiments of the present disclosure, in which a control system of the controller is shown in a block diagram.

As shown in FIG. 3, a controller 121, which is a control part (control means or unit), is configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, e.g., a touch panel or the like, is connected to the controller 121. Further, an external memory 123 may be connected to the controller 121.

The memory 121c includes, for example, a flash memory, a hard disk drive (HDD), or the like. A control program that controls operations of a substrate processing apparatus, a process recipe in which sequences and conditions of substrate processing to be described later are written, and the like are readably stored in the memory 121c. The process recipe functions as a program that causes, by the controller 121, the substrate processing apparatus to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121b is configured as a memory area (work area) in which programs or data read by the CPU 121a are temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotator 267, the boat elevator 115, the shutter opening/closing mechanism 115s, and so on.

The CPU 121a is configured to read and execute the control program from the memory 121c. The CPU 121a is also configured to read the recipe from the memory 121c according to an input of an operation command from the input/output device 122. The CPU 121a is configured to be capable of controlling the flow rate regulation operation of various kinds of materials (gases) by the MFCs 241a to 241h, the opening/closing operation of the valves 243a to 243h, the opening/closing operation of the APC valve 244, the pressure regulation operation performed by the APC valve 244 based on the pressure sensor 245, the actuating and stopping operation of the vacuum pump 246, the temperature regulation operation performed by the heater 207 based on the temperature sensor 263, the operation of rotating the boat 217 with the rotator 267 and adjusting the rotation speed of the boat 217, the operation of moving the boat 217 up or down by the boat elevator 115, the opening/ closing operation of the shutter 219s by the shutter opening/ closing mechanism 115s, and so on, according to contents of the read recipe.

The controller 121 may be configured by installing, on the computer, the aforementioned program stored in the external memory 123. Examples of the external memory 123 may include a magnetic disk such as a HDD, an optical disc such as a CD, a magneto-optical disc such as an MO, a semiconductor memory such as an USB memory or a SSD, and the like. The memory 121c or the external memory 123 is configured as a computer-readable recording medium. Here-inafter, the memory $121c$ and the external memory $123$ may be generally and simply referred to as a "recording medium." When the term "recording medium" is used herein, it may indicate a case of including the memory $121c$, a case of including the external memory $123$, or a case of including both the memory $121c$ and the external memory $123$. Furthermore, the program may be provided to the computer by using communication means or unit such as the Internet or a dedicated line, instead of using the external memory $123$.

(2) Substrate Processing Process

As a process of manufacturing a semiconductor device by using the above-described substrate processing apparatus, an example of a method of processing a substrate, that is, a processing sequence of removing a native oxide film formed on a surface of a wafer $200$ as a substrate and growing a film on the surface of the wafer $200$ after removing the native oxide film, will be described mainly with reference to FIGS. $4$A to $4$E, $5$, and $6$. In the following descriptions, operations of the respective components constituting the substrate processing apparatus are controlled by the controller $121$.

A processing sequence in the embodiments of the present disclosure includes:

(a) step A of forming a modified layer by modifying at least a portion of an oxide film as a native oxide film of a wafer $200$ by performing, a predetermined number of times (n times, where n is an integer of 1 or more): (a1) step A1 of supplying a F-containing gas to the wafer $200$ including the oxide film and (a2) step A2 of supplying a first reducing gas to the wafer $200$;

(b) step B of supplying the F-containing gas to the wafer $200$ after the modified layer is formed.

At this time, (a) and (b), that is, step A and step B, may be performed in a state where a temperature of the wafer $200$ is set at a first temperature.

Further, the processing sequence in the embodiments of the present disclosure includes:

(c) step C of sublimating the modified layer by setting the temperature of the wafer $200$ to a second temperature equal to or higher than the first temperature, specifically from the first temperature to the second temperature, after (b).

In this way, in the embodiments of the present disclosure, by performing step A, step B, and step C in this order, it is possible to etch the oxide film formed on the surface of the wafer $200$ by modifying and sublimating the oxide film.

Further, the processing sequence in the embodiments of the present disclosure includes:

(d) step D of raising the temperature of the wafer $200$ from the second temperature to a third temperature, after (c).

Further, the processing sequence in the embodiments of the present disclosure includes:

(e) step E of supplying a second reducing gas to the wafer $200$ in a state where the temperature of the wafer $200$ is set at the third temperature.

Further, (e), that is, step E, includes:

(e1) step E1 of supplying the second reducing gas to the wafer $200$ in a state where a pressure of a space in which the wafer $200$ is placed is set to a first pressure; and (e2) step E2 of supplying the second reducing gas to the wafer $200$ in a state where the pressure of the space in which the wafer $200$ is placed is set to a second pressure higher than the first pressure.

Further, the processing sequence in the embodiments of the present disclosure includes:

(f) step F of forming a predetermined element-containing film on the wafer $200$ by lowering the temperature of the wafer $200$ from the third temperature to a fourth temperature and supplying a gas containing a predetermined element to the wafer $200$ in a state where the temperature of the wafer $200$ is set at the fourth temperature.

When the term "wafer" is used in the present disclosure, it may refer to a wafer itself or a stacked body of a wafer and certain layers or films formed on a surface of the wafer. When the phrase "a surface of a wafer" is used in the present disclosure, it may refer to a surface of a wafer itself or a surface of a certain layer and the like formed on a wafer. When the expression "a certain layer is formed on a wafer" is used in the present disclosure, it may mean that a certain layer is formed directly on a surface of a wafer itself or that a certain layer is formed on a layer and the like formed on a wafer." When the term "substrate" is used in the present disclosure, it may be synonymous with the term "wafer."

(Wafer Charging and Boat Loading)

After the boat $217$ is charged with a plurality of wafers $200$ (wafer charging), the shutter $219s$ is moved by the shutter opening/closing mechanism $115s$ and the lower end opening of the manifold $209$ is opened (shutter open). Thereafter, as shown in FIG. $1$, the boat $217$ charged with the plurality of wafers $200$ is lifted up by the boat elevator $115$ to be loaded into the process chamber $201$ (boat loading). In this state, the seal cap $219$ seals the lower end of the manifold $209$ via the O-ring $220b$. In this way, the wafers $200$ are loaded into the process chamber $201$.

(Pressure Regulation and Temperature Regulation)

After the boat loading is completed, the interior of the process chamber $201$, that is, a space where the wafers $200$ are placed, is vacuum-exhausted (decompression-exhausted) by the vacuum pump $246$ to reach a desired pressure (state of vacuum). At this time, the internal pressure of the process chamber $201$ is measured by the pressure sensor $245$, and the APC valve $244$ is feedback-controlled based on the measured pressure information. Further, the wafers $200$ in the process chamber $201$ are heated by the heater $207$ such that the temperature of the wafers $200$ become a desired processing temperature (first temperature). At this time, the state of supplying electric power to the heater $207$ is feedback-controlled based on the temperature information detected by the temperature sensor $263$ so that a temperature distribution in the process chamber $201$ becomes a desired temperature distribution. Further, the rotation of the wafers $200$ by the rotator $267$ is started. The exhaust of the interior of the process chamber $201$ and the heating and rotation of the wafers $200$ are continuously performed at least until the processing on the wafers $200$ is completed.

Here, the surface of the wafer $200$ may be temporarily exposed to the atmospheric air until the wafer $200$ is loaded into the process chamber $201$. Therefore, as shown in FIG. $4$A, an oxide film $300$, which is a native oxide film, may be formed on at least a portion of the surface of the wafer $200$ loaded into the process chamber $201$. Therefore, first, before forming a film on the wafer $200$, the following process is performed.

[Modifying Step (Step A, Step B)]

A step of modifying the oxide film $300$ formed on the surface of the wafer $200$ into a modified layer $400$, which is easily sublimated in a sublimating step to be described later, and further modifying the modified layer 400 into a modified layer 500 with small amount of impurities such as N is performed. That is, the following step A and step B are performed in this order.

(Step A)

In step A, in a state where the temperature of the wafer 200 is set at a first temperature, step A1 of supplying a F-containing gas to the wafer 200 and step A2 of supplying a first reducing gas to the wafer 200 are performed a predetermined number of times (n times, where n is an integer of 1 or more). As a result, at least a portion of the oxide film 300 is modified to form the modified layer 400.

[Step A1]

Specifically, in step A1, the valve 243a is opened to allow the F-containing gas to flow through the gas supply pipe 232a. The flow rate of the F-containing gas is regulated by the MFC 241a, and the F-containing gas is supplied into the process chamber 201 via the nozzle 249a and exhausted via the exhaust port 231a. In this operation, the F-containing gas is supplied to the wafer 200 from the side of the wafer 200. At this time, the valves 243f to 243h may be opened to allow an inert gas to be supplied into the process chamber 201 via the nozzles 249a to 249c, respectively.

A process condition when supplying the F-containing gas in step A1 is exemplified as follows.

Processing temperature (first temperature): room temperature (25 degrees C.) to 90 degrees C., specifically 45 to 80 degrees C., more specifically 50 to 70 degrees C.

Processing pressure: 10 to 2,000 Pa, specifically 50 to 1,000 Pa

F-containing gas supply flow rate: 0.5 to 3 slm, specifically 1 to 2 slm

Inert gas supply flow rate (for each gas supply pipe): 0.5 to 10 slm, specifically 1 to 5 slm Gas supply time: 60 to 180 seconds, specifically 60 to 120 seconds In the present disclosure, notation of a numerical range such as "room temperature to 90 degrees C." means that a lower limit value and an upper limit value are included in the range. Therefore, for example, "room temperature to 90 degrees C." means "room temperature or higher and 90 degrees C. or lower." The same applies to other numerical ranges. In the present disclosure, the processing temperature means the temperature of the wafer 200 or the internal temperature of the process chamber 201, and the processing pressure means the internal pressure of the process chamber 201. Further, the processing time means the time during which the processing is continued. Further, when 0 slm is included in the supply flow rate of substance (gas), 0 slm means a case where no substance (gas) is supplied. The same applies the following description.

By supplying the F-containing gas to the wafer 200 under the above-mentioned process condition, it is possible to cause molecules of the F-containing gas to be adsorbed on the surface of the wafer 200, that is, on the surface of the oxide film 300 formed on the surface of the wafer 200. In addition, it is possible to make the interior of the process chamber 201 into an F-containing gas atmosphere.

Examples of the F-containing gas may include a fluorine ($F_2$) gas, a chlorine trifluoride ($ClF_3$) gas, a chlorine monofluoride (ClF) gas, a nitrogen trifluoride ($NF_3$) gas, a hydrogen fluoride (HF) gas, and the like. One or more of these gases may be used as the F-containing gas. As the F-containing gas, specifically, a F- and H-containing gas such as a HF gas may be used.

As the inert gas, a rare gas such as a nitrogen ($N_2$) gas, an argon (Ar) gas, a helium (He) gas, a neon (Ne) gas, or a xenon (Xe) gas may be used. One or more of these gases may be used as the inert gas. This point also applies to each step to be described later.

After step A1 is completed, the valve 243a is closed to stop the supply of the F-containing gas into the process chamber 201. After that, step A2 is performed.

[Step A2]

Specifically, in step A2, the valve 243b is opened to allow a first reducing gas to flow through the gas supply pipe 232b. The flow rate of the first reducing gas is regulated by the MFC 241b, and the first reducing gas is supplied into the process chamber 201 via the nozzle 249b and is exhausted via the exhaust port 231a. In this operation, the first reducing gas is supplied to the wafer 200 from the side of the wafer 200. At this time, the valves 243f to 243h may be opened to allow the inert gas to be supplied into the process chamber 201 via the nozzles 249a to 249c, respectively.

A process condition when supplying the first reducing gas in step A2 is exemplified as follows.

Processing temperature (first temperature): room temperature (25 degrees C.) to 90 degrees C., specifically 45 to 80 degrees C., more specifically 50 to 70 degrees C.

Processing pressure: 10 to 2,000 Pa, specifically 50 to 1,000 Pa

First reducing gas supply flow rate: 0.1 to 2 slm, specifically 0.2 to 1 slm

Inert gas supply flow rate (for each gas supply pipe): 0.5 to 10 slm, specifically 1 to 5 slm Gas supply time: 60 to 180 seconds, specifically 60 to 120 seconds By supplying the first reducing gas to the wafer 200 under the above-mentioned process condition, it is possible to make reaction among the molecules of the F-containing gas adsorbed on the surface of the oxide film 300 on the surface of the wafer 200, molecules of the first reducing gas, and the oxide film 300 formed on the surface of the wafer 200. At this time, it is also possible to make reaction among the molecules of the F-containing gas floating in the process chamber 201, the molecules of the first reducing gas, and the oxide film 300 formed on the surface of the wafer 200. At least a portion of the oxide film 300 may be modified by these reactions.

With the progress of these reactions, a H- and O-containing substance such as water ($H_2O$) may be generated. In addition, with the progress of these reactions, by-products such as an F- and Si-containing substance including silicon tetrafluoride ($SiF_4$), hexafluorosilicic acid ($H_2SiF_6$), and ammonium hexafluorosilicate (($NH_4$)$_2SiF_6$, also referred to as ammonium silicofluoride) may be generated. These substances may be contained in a portion where at least a portion of the oxide film 300 is modified.

A N- and H-containing gas may be used as the first reducing gas. Examples of the N- and H-containing gas may include hydrogen nitride-based gases such as an ammonia ($NH_3$) gas, a diazene ($N_2H_2$) gas, a hydrazine ($N_2H_4$) gas, and a $N_3H_8$ gas. One or more of these gases may be used as the first reducing gas.

After step A2 is completed, the valve 243b is closed to stop the supply of the first reducing gas into the process chamber 201.

[Performing Predetermined Number of Times]

Figure 4A:
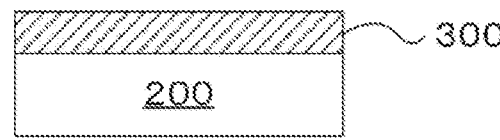
FIG. 4A is a schematic cross-sectional view showing a surface portion of a substrate on which an oxide film is formed.
Figure 4B:
FIG. 4B is a schematic cross-sectional view showing the surface portion of the substrate after the oxide film on the surface is modified into a modified layer by performing supply of a fluorine-containing gas and supply of a first reducing gas a predetermined number of times from the state of FIG. 4A.

By performing a cycle a predetermined number of times (n times, where n is an integer of 1 or more), the cycle including alternately performing the above-described steps A1 and A2, at least a portion of the oxide film 300 formed on the surface of the wafer 200 may be modified into the modified layer 400 that is easily sublimated, as shown in FIG. 4B. The modified layer 400 contains a complex. FIG. 4B shows an example in which the oxide film 300 formed on the surface of the wafer 200 is entirely modified into the modified layer 400.

When the N- and H-containing gas is used as the first reducing gas, the molecules of the F-containing gas supplied to the wafer 200 in step A1, the molecules of the N- and H-containing gas supplied to the wafer 200 in step A2, and the oxide film 300 on the surface of the wafer 200 react to form the modified layer 400 containing N, H, Si, and F on the surface of the oxide film 300. The modified layer 400 contains the complex. At this time, by-products such as a F- and Si-containing substance such as ammonium silicofluoride and a H- and O-containing substance such as water ($H_2O$) are generated. These substances may be contained in the modified layer 400. By controlling the number of cycles in which step A1 and step A2 are alternately performed, it is possible to finely control a thickness of the modified layer to be sublimated in the subsequent step. As a result, it is possible to precisely control an etching amount.

However, when step A1 and step A2 are alternately performed in this order to form the modified layer 400, impurities derived from the first reducing gas such as the N- and H-containing gas may remain on the surface of the wafer 200 and inside the process chamber 201, which may cause particle generation. Therefore, in the embodiments of the present disclosure, after step A is performed, step B is performed to remove the impurities derived from the first reducing gas remaining on the surface of the wafer 200 and the like.

(Step B)

In step B, a F-containing gas is supplied to the wafer 200 after step A is performed. Step B may be performed in the same processing procedure as step A1.

A process condition when supplying the F-containing gas in step B are exemplified as follows.

Processing temperature (first temperature): room temperature (25 degrees C.) to 90 degrees C., specifically 45 to 80 degrees C., more specifically 50 to 70 degrees C.

Processing pressure: 10 to 3,000 Pa, specifically 10 to 2,000 Pa

F-containing gas supply flow rate: 0.5 to 5 slm, specifically 1 to 3 slm

Inert gas supply flow rate (for each gas supply pipe): 0.5 to 10 slm, specifically 1 to 5 slm Gas supply time: 60 to 300 seconds, specifically 60 to 180 seconds By supplying the F-containing gas to the wafer 200 under the above-mentioned process condition, the impurities (such as N) derived from the first reducing gas remaining on the surface of the wafer 200 and inside the process chamber 201 may be removed by reaction with the F-containing gas. As a result, it is possible to suppress the generation of particles caused by the impurities derived from the first reducing gas remaining on the surface of the wafer 200 and inside the process chamber 201. In addition, it is possible to suppress an increase in interface impurity concentration (N concentration and the like) of the wafer 200 due to the residual impurities derived from the first reducing gas on the surface of the wafer 200 and inside the process chamber 201. The interface impurity concentration of the wafer 200 means the impurity concentration at the interface between the wafer 200 and a film formed on the wafer 200. This also applies to the following description.

Figure 4C:
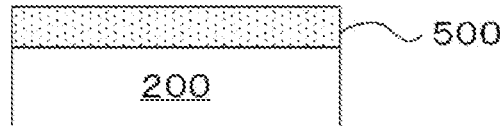
FIG. 4C is a schematic cross-sectional view showing the surface portion of the substrate after the modified layer on the surface is modified into a modified layer by supplying a fluorine-containing gas after FIG. 4B.

At this time, as shown in FIG. 4C, at least a portion of the modified layer 400 formed on the surface of the wafer 200 in step A is modified into a modified layer 500 containing fewer impurities such as N than the modified layer 400. However, the surface of the modified layer 400 is modified, and the composition of the modified layer 500 is the same as the composition of the modified layer 400 except for the N concentration on the surface. That is, the modified layer 500 is the same as the modified layer 400 except for the N concentration on the surface, and becomes a substance that is easily sublimated, like the modified layer 400. Therefore, the modified layer 500 also contains the complex, like the modified layer 400. For these reasons, sublimating the modified layer 500 in step C is synonymous with sublimating the modified layer 400.

In this way, by performing step B after performing step A, the amount of impurities such as N derived from the first reducing gas contained in the modified layer 400 may be reduced, and the impurities derived from the first reducing gas can be suppressed from remaining on the surface of the wafer 200 and inside the process chamber 201. That is, when the first reducing gas is supplied, after that, by supplying the F-containing gas under the condition that the impurities derived from the first reducing gas may be removed, it is possible to resolve the above-mentioned matters caused by the residual impurities derived from the first reducing gas. Then, after step B is performed, by not supplying the first reducing gas, it is possible to keep the surface of the wafer 200 and the interior of the process chamber 201 in a state where the impurities derived from the first reducing gas are removed.

The process condition in step B may be the same as the process condition in step A1, but the process condition in step B may be made different from the process condition in step A1 depending on the amount of impurities derived from the first reducing gas remaining on the surface of the wafer 200 and inside the process chamber 201. Examples of the process conditions that are different between step B and step A1 may include the supply flow rate of F-containing gas, the supply flow rate of inert gas, the partial pressure of F-containing gas, the concentration of F-containing gas, the processing pressure (pressure of the space where the wafer 200 is placed), the supply time of F-containing gas, and the like.

For example, when the amount of impurities derived from the first reducing gas remaining on the surface of the wafer 200 and inside the process chamber 201 is large, the supply flow rate of the F-containing gas in step B may be set to be larger (higher) than the supply flow rate of the F-containing gas in step A1. Further, in this case, the supply flow rate of the inert gas in step B may be set to be smaller (lower) than the supply flow rate of the inert gas in step A1. Further, in this case, the partial pressure (concentration) of the F-containing gas in step B may be set to be larger (higher) than the partial pressure (concentration) of the F-containing gas in step A1. Further, in this case, the processing pressure in step B may be set to be larger (higher) than the processing pressure in step A1. Further, in this case, the supply time of the F-containing gas in step B may be set to be longer than the supply time of the F-containing gas in step A1.

Further, for example, when the amount of impurities derived from the first reducing gas remaining on the surface of the wafer 200 and inside the process chamber 201 is small, the supply flow rate of the F-containing gas in step B may be set to be smaller (lower) than the supply flow rate of the F-containing gas in step A1. Further, in this case, the supply flow rate of the inert gas in step B may be set to be larger (higher) than the supply flow rate of the inert gas in step A1. Further, in this case, the partial pressure (concentration) of the F-containing gas in step B may be set to be smaller (lower) than the partial pressure (concentration) of the F-containing gas in step A1. Further, in this case, the processing pressure in step B may be set to be smaller (lower) than the processing pressure in step A1. Further, in this case, the supply time of the F-containing gas in step B may be set to be shorter than the supply time of the F-containing gas in step A1.

In either case, it is possible to change the processing temperature between step B and step A1, but considering a throughput, that is, productivity, the same temperature may be maintained without changing the processing temperature.

After step B is completed, the valve 243a is closed to stop the supply of the F-containing gas into the process chamber 201.

Here, in a case where the first temperature, which is the processing temperature in step A and step B, is lower than the room temperature, the reaction at the time of forming the above-described modified layer 400 and modified layer 500 becomes excessive, which may result in damage to quartz members such as the reaction tube 203 and the boat 217. This matter may be resolved by setting the first temperature to the room temperature or higher. By setting the first temperature to 45 degrees C. or higher, it is possible to effectively resolve this matter, and by setting the first temperature to 50 degrees C. or higher, it is possible to more effectively resolve this matter.

In addition, in a case where the first temperature is higher than 90 degrees C., the reaction at the time of forming the above-described modified layer 400 and modified layer 500 is weakened and may be insufficient, which may result in insufficient etching of the oxide film 300. Further, in a case where the first temperature is higher than 90 degrees C., particles may be easily generated. These matters may be resolved by setting the first temperature to 90 degrees C. or lower. By setting the first temperature to 80 degrees C. or lower, it is possible to effectively resolve these matters, and by setting the first temperature to 70 degrees C. or lower, it is possible to more effectively resolve these matters.

For these reasons, the first temperature may be the room temperature or higher and 90 degrees C. or lower, specifically 45 degrees C. or higher and 80 degrees C. or lower, more specifically 50 degrees C. or higher and 70 degrees C. or lower.

[Sublimating Step (step C)]

After step B is completed, step C is performed. In step C, a process of sublimating the modified layer 500 formed on the surface of the wafer 200 by raising the temperature of the wafer 200 to a second temperature equal to or higher than the first temperature, specifically from the first temperature to the second temperature, is performed.

Specifically, the output of the heater 207 is regulated so that the temperature of the wafer 200 is changed to the second temperature equal to or higher than the first temperature, specifically to the second temperature higher than the first temperature. Then, the APC valve 244 is regulated to exhaust the interior of the process chamber 201 so that the processing pressure becomes lower than the processing pressure in step A and step B. At this time, the valves 243f to 243h are opened to allow an inert gas as a purge gas to flow through the gas supply pipes 232f to 231h, respectively. The flow rate of the inert gas is regulated by the MFCs 241f to 241h, and the inert gas is supplied into the process chamber 201 via the nozzles 249a to 249c and is exhausted via the exhaust port 231a, together with a substance gasified by the sublimation of the modified layer 500. At this time, the valve 243c may be opened to allow a second reducing gas as a purge gas to flow through the gas supply pipe 232c. The flow rate of the second reducing gas is regulated by the MFC 241c, and the second reducing gas is supplied into the process chamber 201 via the nozzle 249c and is exhausted via the exhaust port 231a, together with the substance gasified by the sublimation of the modified layer 500.

A process condition in step C is exemplified as follows.

Processing temperature (second temperature): 90 to 200 degrees C., specifically 100 to 150 degrees C.

Processing pressure: 10 to 300 Pa, specifically 30 to 100 Pa

Figure 4D:
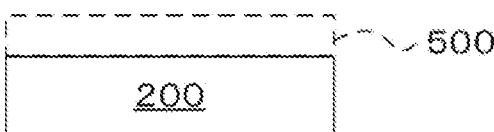
FIG. 4D is a schematic cross-sectional view showing the surface portion of the substrate after the modified layer is removed by performing a sublimating step from the state of FIG. 4C.
Figure 4E:
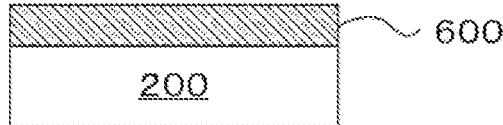
FIG. 4E is a schematic cross-sectional view showing the surface portion of the substrate after an epitaxial film is formed on the surface by performing a film-forming step from the state of FIG. 4D.

Inert gas supply flow rate (for each gas supply pipe): 0 to 20 slm, specifically 1 to 10 slm Second reducing gas supply flow rate: 0 to 10 slm, specifically 1 to 5 slm Gas supply time: 60 to 720 minutes, specifically 120 to 300 minutes By performing this step under the above-mentioned process condition, it is possible to sublimate and remove the modified layer 500 formed on the surface of the wafer 200, as shown in FIG. 4D. That is, it is possible to sublimate the modified layer 500 formed on the surface of the wafer 200 into a gaseous substance and exhaust and remove the gaseous substance from the process chamber 201 to the outside of the process chamber 201 via the exhaust port 231a. At this time, in a case where by-products similar to the modified layer 500 adhere to other surfaces of the wafer 200 or inside the process chamber 201, it is also possible to sublimate and remove these by-products similarly from the process chamber 201.

Further, in this step, when the second reducing gas is supplied into the process chamber 201, the second reducing gas may be continuously supplied into the process chamber 201 until a film-forming step to be described later is completed. By continuing the supply of the second reducing gas until the film-forming step is completed, substances that tend to adhere and remain on the surface of the wafer 200 and inside the process chamber 201 and the residual substances may continue to be reduced to moisture, organic matter, and the like. As a result, it is possible to reduce the amount of impurities mixed into a film formed in the film-forming step.

As the second reducing gas, a N-free and H-containing gas may be used. As the N-free and H-containing gas, for example, a hydrogen (H₂) gas, a deuterium (D₂) gas, or the like may be used. One or more of these gases may be used as the second reducing gas.

Here, in a case where the second temperature, which is the processing temperature in step C, is lower than 90 degrees C., the modified layer 500 containing the complex may not be sufficiently sublimated, which may result in insufficient etching of the oxide film 300. This matter may be resolved by setting the second temperature to 90 degrees C. or higher. By setting the second temperature to 100 degrees C. or higher, it is possible to effectively resolve this matter.

In a case where the second temperature is higher than 200 degrees C., particles and haze are likely to occur after the film-forming step to be described later. This matter may be resolved by setting the second temperature to 200 degrees C. or lower. By setting the second temperature to 150 degrees C. or lower, this matter may be effectively solved.

For these reasons, the second temperature may be 90 degrees C. or higher and 200 degrees C. or lower, specifically 100 degrees C. or higher and 150 degrees C. or lower.

Further, in this step, a cycle purge may be performed while sublimating the modified layer 500. At this time, at least one selected from the group of the inert gas and the second reducing gas may be used as a purge gas. That is, while sublimating the modified layer 500, the purge of the interior of the process chamber 201 and the exhaust (vacuum-exhaust) of the interior of the process chamber by the supply of at least one selected from the group of the inert gas and the second reducing gas into the process chamber 201 may be alternately performed a predetermined number of times, specifically a plurality of times. As a result, it is possible to efficiently and effectively discharge and remove the substance gasified by the sublimation of the modified layer 500 from the interior of the process chamber 201. When the cycle purge is performed, opening/closing control of the valves 243f to 243h, the valve 243c, and the like is appropriately performed in accordance with the supply timing of the inert gas and the second reducing gas.

A process condition when performing the cycle purge in step C is exemplified as follows.

Figure 6:
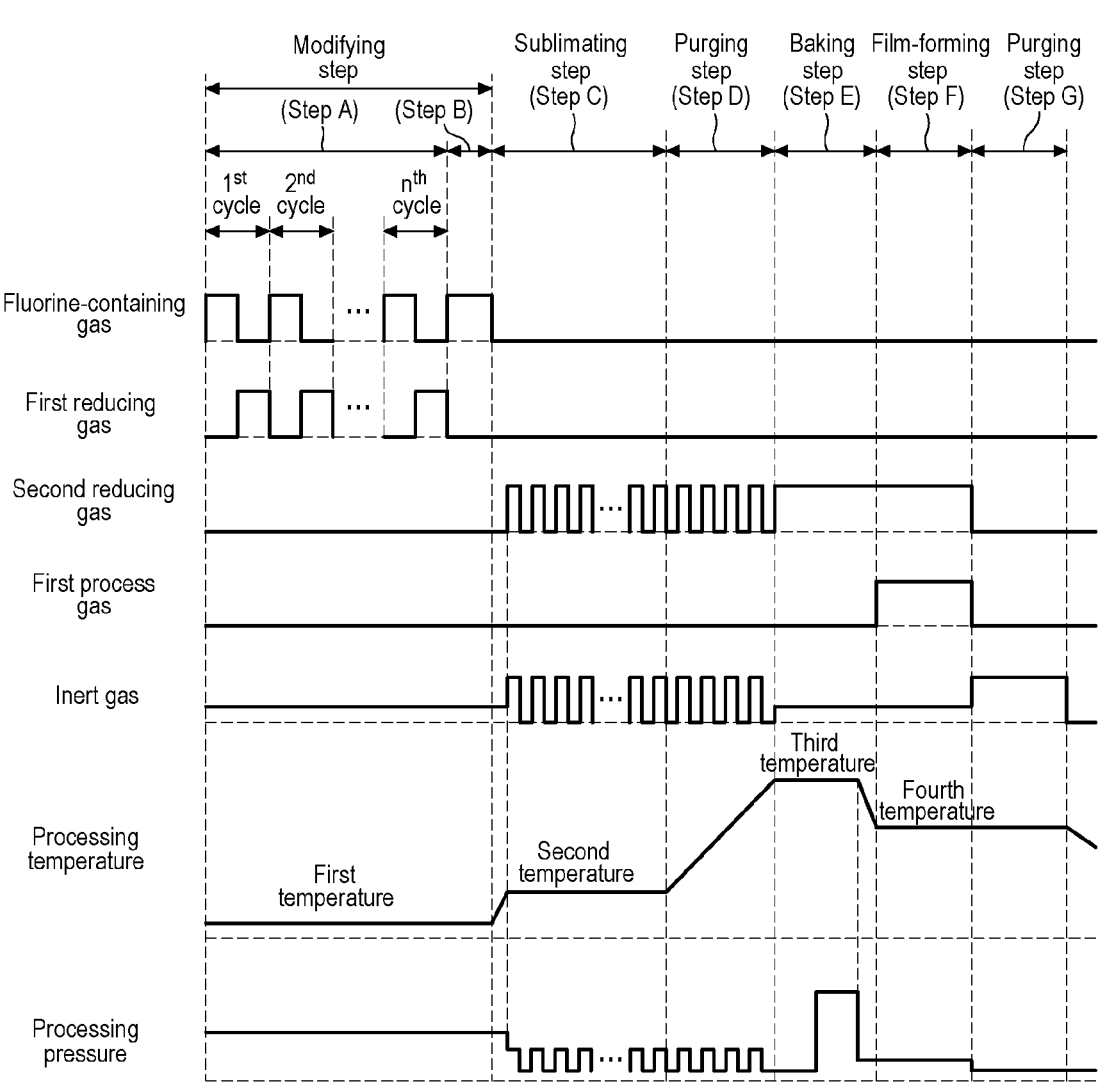
FIG. 6 is a diagram showing a processing sequence from a modifying step (step A) to a purging step (step G) in the embodiments of the present disclosure.

> Processing temperature (second temperature): 90 to 200 degrees C., specifically 100 to 150 degrees C.
> Processing pressure at the time of purge gas supply: 30 to 300 Pa
> Processing pressure at the time of vacuum exhaust: 10 to 100 Pa
> Purge gas supply flow rate: 1 to 20 slm, specifically 1 to 10 slm
> Purge gas supply time: 30 to 180 seconds/cycle
> Vacuum exhaust time: 30 to 180 seconds/cycle In this case, the supply of the inert gas into the process chamber 201 and the exhaust of the interior of the process chamber 201 may be alternately performed a predetermined number of times, specifically a plurality of times. Further, the supply of the second reducing gas into the process chamber 201 and the exhaust of the interior of the process chamber 201 may be alternately performed a predetermined number of times, specifically a plurality of times. Further, the supply of the inert gas and the second reducing gas into the process chamber 201 and the exhaust of the interior of the process chamber 201 may be alternately performed a predetermined number of times, specifically a plurality of times. FIG. 6 shows an example in which in step C, the supply of the inert gas and the second reducing gas into the process chamber 201 and the exhaust of the interior of the process chamber 201 are alternately performed a plurality of times.

Further, in this case, in a state where the second reducing gas is continuously supplied into the process chamber 201, the supply of the inert gas into the process chamber 201 and the exhaust of the interior of the process chamber 201 may be alternately performed a predetermined number of times, specifically a plurality of times. Further, in a state where the inert gas is continuously supplied into the process chamber 201, the supply of the second reducing gas into the process chamber 201 and the exhaust of the interior of the process chamber 201 may be alternately performed a predetermined number of times, specifically a plurality of times.

In any of these cases, it is possible to efficiently and effectively discharge and remove the substance gasified by the sublimation of the modified layer 500 from the process chamber 201. When the inert gas is used as the purge gas, the interior of the process chamber 201 is purged mainly by a physical action. On the other hand, when the second reducing gas is used as the purge gas, the physical action as well as a chemical action may be produced, making it possible to further enhance the purge effect. When the cycle purge is performed, either the supply of the purge gas into the process chamber 201 or the exhaust of the interior of the process chamber 201 may be performed first.

[Purging Step (Step D)]

After step C is completed, step D is performed. In step D, a cycle purge is performed while raising the temperature of the wafer 200 from the second temperature to a third temperature to be described later.

The processing procedure and process condition when performing the cycle purge in this step may be the same as those for the various cycle purges described in step C except that the processing temperature is raised from the second temperature to the third temperature. FIG. 6 shows an example in which in step D, the supply of the inert gas and the second reducing gas into the process chamber 201 and the exhaust of the interior of the process chamber 201 are alternately performed a plurality of times.

In this step, by performing the above-described cycle purge while raising the temperature of the wafer 200 from the second temperature to the third temperature, it is possible to efficiently and effectively discharge and remove a F-containing substance remaining on the surface of the wafer 200 and inside the process chamber 201 from the interior of the process chamber 201. As a result, it is also possible to suppress an increase in interface impurity concentration (F concentration) of the wafer 200 due to residual impurities containing the F-containing substance on the surface of the wafer 200 and inside the process chamber 201.

Further, when the inert gas is used as the purge gas, physical desorption of the F-containing substance may be promoted, making it possible to effectively remove the F-containing substance remaining inside the process chamber 201. Further, when the second reducing gas is used as the purge gas, in addition to the physical desorption of the F-containing substance, chemical desorption may also be promoted, making it possible to more efficiently and effectively remove the F-containing substance remaining inside the process chamber 201.

Further, performing the above-described cycle purge while raising the temperature of the wafer 200 from the second temperature to the third temperature, that is, while gradually increasing a thermal energy given to the surface of the wafer 200 and the interior of the process chamber 201, it is possible to more efficiently and effectively remove the F-containing substance remaining inside the process chamber 201. Further, by performing the above-described cycle purge in parallel with the temperature rise from the second temperature to the third temperature, a step of removing the F-containing substance remaining inside the process chamber 201 may not be provided separately, making it possible to shorten a total processing time, thereby improving a throughput, that is, productivity.

[Baking Step (Step E)]

After step D is completed, step E is performed. In step E, in a state where the wafer 200 is heated to the third temperature, a second reducing gas is supplied to the wafer 200. That is, a baking process is performed under a second reducing gas atmosphere. In a case where the second reducing gas is supplied in step C, the supply is continued in step D as well.

Specifically, the output of the heater 207 is regulated to maintain the temperature of the wafer 200 at the third temperature. Then, the valve 243c is opened or the valve 243c is kept open to allow the second reducing gas to flow through the gas supply pipe 232c. The flow rate of the second reducing gas is regulated by the MFC 241c, and the second reducing gas is supplied into the process chamber 201 via the nozzle 249c and is exhausted via the exhaust port 231a. In this operation, the second reducing gas is supplied to the wafer 200 from the side of the wafer 200.

A process condition in step E is exemplified as follows.

Processing temperature (third temperature): 700 to 1,000 degrees C., specifically 800 to 900 degrees C.

Processing pressure: 30 to 2,000 Pa, specifically 30 to 1,000 Pa

Second reducing gas supply flow rate: 1 to 10 slm, specifically 1 to 5 slm

Inert gas supply flow rate (for each gas supply pipe): 0 to 20 slm, specifically 1 to 10 slm Gas supply time: 30 to 120 minutes, specifically 30 to 90 minutes By supplying the second reducing gas to the wafer 200 under the above-mentioned process condition, it is possible to remove a substance containing by-products such as organic matter and moisture remaining on the surfaces of the wafer 200 and inside the process chamber 201 by reaction with the second reducing gas. At this time, in a case where substances that could not be completely removed in steps C and D remain on the surface of the wafer 200 or inside the process chamber 201, it is also possible to remove these substances by reaction with the second reducing gas. That is, by this step, the surface of the wafer 200 and the interior of the process chamber 201 may be brought into a clean state, and the clean state may be maintained until the film-forming step is performed.

Here, in a case where the third temperature, which is the processing temperature in step E, is lower than 700 degrees C., the concentration of impurities containing organic matter at the interface of the wafer 200 may not be sufficiently reduced. This matter may be resolved by setting the third temperature to 700 degrees C. or higher. This matter may be effectively resolved by setting the third temperature to 800 degrees C. or higher.

In a case where the third temperature is higher than 1,000 degrees C., it may damage members such as an O-ring that constitute the substrate processing apparatus. In addition, the time for raising or lowering the temperature of the wafer 200 increases, which may affect the throughput, that is, productivity. This matter may be resolved by setting the third temperature to 1,000 degrees C. or lower. This matter may be effectively resolved by setting the third temperature to 900 degrees C. or lower.

For these reasons, the third temperature may be 700 degrees C. or higher and 1,000 degrees C. or lower, specifically 800 degrees C. or higher and 900 degrees C. or lower.

Further, in step E, step E1 of supplying the second reducing gas to the wafer 200 in a state where the internal pressure of the process chamber 201 is set to a first pressure and step E2 of supplying the second reducing gas to the wafer 200 in a state where the internal pressure of the process chamber 201 is set to a second pressure higher than the first pressure may be performed. FIG. 6 shows an example of performing the baking process in two steps of lower pressure and higher pressure in step E, in this way. In this case, the first pressure may be, for example, 1 to 600 Pa, specifically 1 to 30 Pa, and the second pressure may be, for example, 700 to 2,000 Pa, specifically 1,000 to 1,500 Pa. Further, the first pressure may be a pressure equal to or lower than the respective processing pressures in steps A to D and F and the second pressure may be a pressure higher than the respective processing pressures in steps A to D and F. Furthermore, the first pressure may be a pressure lower than the respective processing pressures in steps A and B.

By performing step E1 under the above-mentioned process condition, that is, by performing the baking processing at the lower pressure, in particular, it is possible to efficiently and effectively remove an O-containing substance such as moisture remaining on the surface of the wafer 200 and inside the process chamber 201 by reaction with the second reducing gas. As a result, it is possible to significantly reduce the interface impurity concentration (O concentration) of the wafer 200.

Further, by performing step E2 under the above-mentioned process condition, that is, by performing the baking process at the higher pressure, in particular, it is possible to efficiently and effectively remove a C-containing substance such as organic matter remaining on the surface of the wafer 200 and inside the process chamber 201 by reaction with the second reducing gas. As a result, it is possible to significantly reduce the interface impurity concentration (C concentration) of the wafer 200.

Further, in step E, in a case where step E1 is performed without performing step E2, the interface impurity concentration (C concentration) of the wafer 200 may not be significantly reduced. Further, in step E, in a case where step E2 is performed without performing step E1, the interface impurity concentration (O concentration) of the wafer 200 may not be significantly reduced. Therefore, both step E1 and step E2 may be perform in step E to significantly reduce both the interface impurity concentration (C concentration) and the interface impurity concentration (O concentration) of the wafer 200. Further, step E2 may be performed after step E1, step E1 may be performed after step E2, or step E1 and step E2 may be performed alternately and repeatedly.

Further, a cycle purge may be performed in parallel with this baking process. The processing procedure and process condition when performing the cycle purge in this step may be the same as those for the cycle purge described in step C except that the processing temperature is set to the third temperature.

By performing the above-described cycle purge in this step, it is possible to more efficiently and effectively discharge and remove a substance containing by-products such as organic matter and moisture remaining on the surface of the wafer 200 and inside the process chamber 201, substances, which could not be completely removed in steps C and D, and the like from the interior of the process chamber 201.

After the baking process under the second reducing gas atmosphere is completed, the temperature of the wafer 200 is lowered from the third temperature to a fourth temperature.

[Film-Forming Step (step F)]

After step E is completed, that is, after the baking process is completed and the temperature of wafer 200 is lowered from the third temperature to the fourth temperature, step F is performed. In step F, in a state where the wafer 200 is heated to the fourth temperature, a first process gas and a second reducing gas are supplied to the wafer 200 to perform a film-forming process of growing a film on the surface of the wafer 200 with the oxide film 300 removed therefrom.

Specifically, by keeping the valve 243c open, the second reducing gas is supplied into the process chamber 201 via the nozzle 249c and is exhausted via the exhaust port 231a. In this state, the valve 243d is opened to allow the first process gas to flow through the gas supply pipe 232d. The flow rate of the first process gas is regulated by the MFC 241$d$, and the first process gas is supplied into the process chamber 201 via the gas supply pipe 232$a$ and the nozzle 249$a$ and is exhausted via the exhaust port 231$a$, together with the second reducing gas. In this operation, the first process gas and the second reducing gas are supplied to the wafer 200 from the side of the wafer 200. At this time, the valves 243$f$ to 243$h$ may be opened to allow an inert gas to be supplied into the process chamber 201 via the nozzles 249$a$ to 249$c$, respectively.

A process conditions in step F is exemplified as follows.

Processing temperature (fourth temperature): 500 to 650 degrees C., specifically 550 to 600 degrees C.

Processing pressure: 4 to 200 Pa, specifically 1 to 120 Pa

First process gas supply flow rate: 0.1 to 5 slm, specifically 0.2 to 3 slm

Second reducing gas supply flow rate: 1 to 20 slm, specifically 1 to 10 slm

Inert gas supply flow rate (for each gas supply pipe): 0 to 20 slm, specifically 0.1 to 10 slm Gas supply time: 20 to 120 minutes, specifically 30 to 60 minutes By supplying the first process gas and the second reducing gas to the wafer 200 under the above-mentioned process condition, an epitaxial Si film, for example, a film containing a predetermined element, may be formed as an epitaxial film 600 on the surface of the wafer 200.

Here, when the wafer 200 is formed of single crystal Si, a native oxide film (the oxide film 300) formed on the surface of the single crystal Si is removed by steps A to C. That is, by steps A to C, Si—O bonds contained in the native oxide film are cut, such that Si bonding hands on the surface of the single crystal Si are in a free state, that is, a state of containing dangling bonds. After that, the surface of the single crystal Si and the interior of the process chamber 201 are cleaned by steps D and E, and the cleaned state is maintained until step F is performed. As a result, the state in which the Si bonding hands are free on the surface of the single crystal Si is maintained until step F is performed. As a result, an environment in which epitaxial growth may easily proceed is provided. By supplying the first process gas and the second reducing gas to the wafer 200 in this state, it is possible to epitaxially grow (vapor phase-epitaxially grow) Si crystals on the single crystal Si while maintaining the state in which the surface of the single crystal Si and the like are cleaned.

Further, when an underlying crystal and a crystal grown on this underlying crystal are made of the same material (Si), this growth is homoepitaxial growth. In the homoepitaxial growth, a crystal with the same lattice constant and made of the same material as the underlying crystal is grown in the same crystal orientation on the underlying crystal. Therefore, in the homoepitaxial growth, it is possible to obtain a high-quality crystal with fewer defects than in heteroepitaxial growth in which the underlying crystal and the crystal grown on this underlying crystal are made of different materials. The embodiments of the present disclosure are not limited to the homoepitaxial growth, but may also be applied to the heteroepitaxial growth.

Here, in a case where the fourth temperature, which is the processing temperature in step F, is lower than 500 degrees C. or higher than 650 degrees C., a crystallinity of the epitaxial film 600 may deteriorate. For example, the epitaxial film 600 may contain many crystal defects. This matter may be resolved by setting the fourth temperature to 500 degrees C. or higher and 650 degrees C. or lower. This matter may be effectively resolved by setting the fourth temperature to 550 degrees C. or higher and 600 degrees C. or lower.

As the first process gas (precursor gas), for example, a gas containing Si, which is a semiconductor element, as a predetermined element, may be used. As the gas containing Si, for example, a gas containing Si and H may be used. As the gas containing Si and H, for example, a silicon hydride compound, that is, a silane-based gas containing a hydrogen compound of Si, may be used. As the first process gas, for example, a silane-based gas such as a monosilane ($SiH_4$) gas or a disilane ($Si_2H_6$) gas may be used. These gases may also be referred to as a halogen-free and Si- and H-containing gas. One or more of these gases may be used as the first process gas.

[Purging Step (Step G)]

After the film-forming step is completed, an inert gas as a purge gas is supplied into the process chamber 201 from each of the nozzles 249$a$ to 249$c$ and is exhausted via the exhaust port 231$a$. As a result, the interior of the process chamber 201 is purged to remove a gas, by-products, and the like remaining in the process chamber 201 from the interior of the process chamber 201 (after-purge). After that, the internal atmosphere of the process chamber 201 is substituted with an inert gas (inert gas substitution), and the internal pressure of the process chamber 201 is returned to the atmospheric pressure (returning to atmospheric pressure).

(Boat Unloading and Wafer Discharging)

After that, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219$s$ is moved and the lower end opening of the manifold 209 is sealed by the shutter 219$s$ via the O-ring 220$c$ (shutter close). The processed wafers 200 are unloaded from the reaction tube 203 and are then discharged from the boat 217 (wafer discharging).

Steps A to G may be performed in the same process chamber (in-situ). Thus, after cleaning the surface of the wafer 200 (after removing the native oxide film) by steps A to E, step F may be performed without exposing the wafer 200 to the atmospheric air, that is, with the surface of the wafer 200 kept clean, making it possible to properly perform epitaxial growth.

(3) Effects of the Embodiments of the Present Disclosure

According to the embodiments of the present disclosure, one or more effects set forth below may be achieved.

(a) A native oxide film formed on the surface of the wafer 200 may be sufficiently modified by performing steps A and B to form a modified layer that is easily sublimated, and it is possible to sufficiently remove the native oxide film formed on the surface of the wafer 200 by sublimating the modified layer by step C.

(b) By performing step B after performing step A, impurities derived from the first reducing gas may be suppressed from remaining on the surface of the wafer 200 and inside the process chamber 201. That is, by performing step A, the impurities derived from the first reducing gas that remain on the surface of the wafer 200 and inside the process chamber 201 may be properly removed by step B, thereby suppressing the residual of the impurities. As a result, it is possible to suppress the generation of particles caused by the impurities derived from the first reducing gas remaining on the surface of the wafer 200 and inside the process chamber 201. Further, it is possible to suppress an increase in the interface impurity concentration (N concentration, and the like) of the wafer 200 due to the impurities derived from the first reducing gas remaining on the surface of the wafer 200 and inside the process chamber 201. In other words, it is possible to reduce the interface impurity concentration (N concentration, and the like) of the wafer 200.

(c) By making the process condition in step B different from the process condition in step A1, it is possible to perform an appropriate process according to the amount of impurities derived from the first reducing gas remaining on the surface of the wafer 200 and inside the process chamber 201. For example, in step B, since insufficient supply of the F-containing gas and insufficient process with the F-containing gas may be avoided, it is possible to avoid the inability to sufficiently remove the impurities derived from the first reducing gas remaining on the surface of the wafer 200 and inside the process chamber 201. Further, for example, in step B, since excessive supply of the F-containing gas and excessive process with the F-containing gas may be avoided, it is also possible to suppress impurities derived from the F-containing gas from easily remaining on the surface of the wafer 200 and inside the process chamber 201.

(d) in step C, by alternately performing, a predetermined number of times, the exhaust of the space in which the wafer 200 is placed and the supply of at least one selected from the group of the inert gas as the purge gas and the second reducing gas into the space in which the wafer 200 is placed, it is possible to efficiently and effectively discharge and remove a substance gasified by the sublimation of the modified layer 500 from the interior of the process chamber 201. When the inert gas is used as the purge gas, it is possible to purge the interior of the process chamber 2 mainly by a physical action. On the other hand, when the second reducing gas is used as the purge gas, the physical action as well as a chemical action may be produced, making it possible to further enhance the purge effect. When the second reducing gas is used as the purge gas, it is possible to remove at least a portion of at least one selected from the group of a C-containing substance and an O-containing substance such as organic matter and moisture remaining on the surface of the wafer 200 and inside the process chamber 201.

(e) In step D, while raising the temperature of the wafer 200 from the second temperature to the third temperature, by alternately performing, a predetermined number of times, the exhaust of the space in which the wafer 200 is placed and the supply of at least one selected from the group of the inert gas as the purge gas and the second reducing gas into the space in which the wafer 200 is placed, it is possible to efficiently and effectively remove the F-containing substance remaining inside the process chamber 201. As a result, it is possible to significantly reduce the interface impurity concentration (F concentration) of the wafer 200. Further, when the inert gas is used as the purge gas, physical desorption of the F-containing substance may be promoted. Further, when the second reducing gas is used as the purge gas, chemical desorption of the F-containing substance may be also promoted in addition to the physical desorption of the F-containing substance, making it possible to further enhance the purge effect. Further, when the second reducing gas is used as the purge gas, it is possible to remove at least a portion of at least one selected from the group of the C-containing substance and the O-containing substance, such as organic matter and moisture remaining on the surface of the wafer 200 and inside the process chamber 201.

(f) In step E, by performing step E1 which is a low-pressure baking process, in particular, it is possible to efficiently and effectively remove the O-containing substance such as moisture remaining on the surface of the wafer 200 and inside the process chamber 201 by reaction with the second reducing gas. As a result, it is possible to significantly reduce the interface impurity concentration (O concentration) of the wafer 200. Further, in step E, by performing step E2 which is a high-pressure baking process, in particular, it is possible to efficiently and effectively remove the C-containing substance such as organic matter remaining on the surface of the wafer 200 and inside the process chamber 201 by reaction with the second reducing gas. As a result, it is possible to significantly reduce the interface impurity concentration (C concentration) of the wafer 200. That is, in step E, by performing both steps E1 and E2, it is possible to significantly reduce both the interface impurity concentration (C concentration) and the interface impurity concentration (O concentration) of the wafer 200.

(g) By continuing the supply of the second reducing gas from the start of step C to the end of step F, substances that tend to adhere and remain on the surface of the wafer 200 and inside the process chamber 201 and the residual substances may continue to be reduced to moisture, organic matter, and the like. As a result, it is possible to reduce the amount of impurities mixed into a film formed in the film-forming step. This makes it possible to form an epitaxial film with high purity.

(h) By controlling the balance of the processing temperature in each step such that the third temperature>the fourth temperature>the second temperature≥the first temperature, or the third temperature>the fourth temperature>the second temperature>the first temperature, it is possible to efficiently cause the reaction for the process in each step.

(i) By controlling the balance of the processing pressure in each step such that the processing pressure in step E2>the processing pressures in steps A and B>the maximum processing pressures in steps C and D>the processing pressure in step F>the processing pressure in step E1 and the minimum processing pressures in steps C and D, it is possible to efficiently cause the reaction for the process in each step.

(j) By performing steps A to E, it is possible to clean the surface of the wafer 200 in multiple stages, and it is possible to maintain the cleaned state until the start of step F. Further, by supplying the second reducing gas in step F, it is possible to maintain the cleaned state even during film formation. As a result, it is possible to significantly reduce the interface impurity concentrations (N concentration, F concentration, C concentration, O concentration, and the like) of the wafer 200.

(4) Modifications

The processing sequence in the embodiments of the present disclosure may be changed as in the following modifications. These modifications may be used in proper combination.

Unless otherwise stated, a processing procedure and a process condition in each step of each modification may be the same as those in each step of the above-described processing sequence.

First Modification

In step A, step A1 of supplying the F-containing gas to the wafer 200 including the native oxide film and step A2 of supplying the first reducing gas to the wafer 200 may be simultaneously performed a predetermined number of times. That is, after step A1 of supplying the F-containing gas and step A2 of supplying the first reducing gas are simultaneously performed the predetermined number of times in step A, step B of supplying the F-containing gas may be performed. Others steps may be the same as the above-described embodiments. This modification may obtain the same effects as in the above-described embodiments. Further, in this modification, a modifying rate in step A may be increased, making it possible to shorten a total processing time, thereby improving a throughput, that is, productivity.

Second Modification

In at least one step selected from the group of steps C to F, the supply of the second reducing gas may not be performed. For example, in step C, the supply of the second reducing gas may not be performed. Further, for example, in step D, the supply of the second reducing gas may be performed. In this case, the purge is performed by the physical action. Even in this case, at least one effect selected from the group of the effects described in the above-described embodiments may be obtained.

Third Modification

In a case where the residual impurities derived from the first reducing gas on the surface of the wafer 200 and inside the process chamber 201 does not matter, step B may be omitted. In this case, step A, step C, step D, step E, and step F may be performed in this order. Others may be the same as the above-described embodiments. Even in this case, at least one effect selected from the group of the effects described in the above-described embodiments may be obtained.

Fourth Modification

In a case where a wafer 200 from which the native oxide film is removed is used, steps A to C may be omitted. In this case, step D, step E, and step F may be performed in this order. Others may be the same as the above-described embodiments. Even in this case, at least one effect selected from the group of the effects described in the above-described embodiments may be obtained.

Fifth Modification

In a case where a wafer 200 from which the native oxide film is removed is used, steps A to D may be omitted. In this case, steps E and F may be performed in this order. Others may be the same as the above-described embodiments. Even in this case, at least one effect selected from the group of the effects described in the above-described embodiments may be obtained.

Sixth Modification

When the O-containing substance and the C-containing substance remaining on the surface of the wafer 200 and inside the process chamber 201 may be sufficiently removed in steps C and D, or when the residual amount of O-containing substance and C-containing substance on the surface of the wafer 200 and inside the process chamber 201 is at an acceptable level, step E may be omitted. In this case, step A, step B, step C, step D, and step F may be performed in this order. In this case, in step D, the temperature of the wafer 200 is raised from the second temperature to the fourth temperature. Others may be the same as the above-described embodiments. Even in this case, at least one effect selected from the group of the effects described in the above-described embodiments may be obtained.

Seventh Modification

In step F, in addition to the first process gas and the second reducing gas, a dopant gas as a second process gas may be supplied to the wafer 200. The dopant gas may be supplied from the above-mentioned dopant gas supply system. As the dopant gas, a gas containing group III elements (P, As, etc.) or group V elements (B, etc.) may be used. As the dopant gas, for example, a phosphine ($PH_3$) gas, an arsine ($AsH_3$) gas, a diborane ($B_2H_6$) gas, a trichloroborane ($BCl_3$) gas, or the like may be used. One or more selected from the group of these gases may be used as the dopant gas. This modification may also obtain the same effects as in the above-described embodiments. According to this modification, it is possible to form a film doped with a dopant (P, As, B, etc.).

Eighth Modification

In step F, the first process gas and the second reducing gas may be alternately supplied to the wafer 200. In this case, as the first process gas, in addition to the above-mentioned silicon hydride compound gas, a halosilane-based gas containing Si as a predetermined element and a halogen or an aminosilane-based gas containing Si as a predetermined element and an amino group may be used.

Examples of the halosilane-based gas may include a chlorosilane-based gas such as a dichlorosilane ($SiH_2Cl_2$) gas, a trichlorosilane ($SiHCl_3$) gas, a tetrachlorosilane ($SiCl_4$) gas, or a hexachlorodisilane ($Si_2Cl_6$) gas, a fluorosilane-based gas such as a tetrafluorosilane ($SiF_4$) gas or a difluorosilane ($SiH_2F_2$) gas, a bromosilane-based gas such as a tetrabromosilane ($SiBr_4$) gas or a dibromosilane ($SiH_2Br_2$) gas, and an iodosilane-based gas such as a tetraiodosilane ($SiI_4$) gas or a diiodosilane ($SiH_2I_2$) gas. One or more selected from the group of these gases may be used as the first process gas.

Examples of the aminosilane-based gas may include a tetrakis(dimethylamino)silane ($Si[N(CH_3)_2]_4$) gas, a tris(dimethylamino)silane ($Si[N(CH_3)_2]_3H$) gas, a bis(diethylamino)silane ($Si[N(C_2H_5)_2]_2H_2$) gas, a bis(tert-butylamino)silane ($SiH_2[NH(C_4H_9)]_2$) gas, a (diisopropylamino)silane ($SiH_3[N(C_3H_7)_2]$) gas, and the like. One or more selected from the group of these gases may be used as the first process gas.

Further, gases of different molecular structures may be alternately supplied to the wafer 200, as the first process gas. For example, a halosilane-based gas and a silicon hydride compound gas may be alternately supplied to the wafer 200. Further, for example, a halosilane-based gas and an aminosilane-based gas may be alternately supplied to the wafer 200. Further, for example, an aminosilane-based gas and a silicon hydride compound gas may be alternately supplied to the wafer 200. Further, for example, a halosilane-based gas, an aminosilane-based gas, and a silicon hydride compound gas may be non-simultaneously supplied to the wafer 200.

This modification may also obtain the same effects as in the above-described embodiments. Further, according to this modification, it is possible to improve controllability and uniformity of a thickness of a film to be formed. Moreover, depending on the combination of gases of different molecular structures, it is possible to perform the film-forming process under a cleaner environment.

Other Embodiments of the Present Disclosure

The embodiments and modifications of the present disclosure are specifically described above. However, the present disclosure is not limited to the above-described embodiments and modifications, and various changes may be made without departing from the gist thereof.

For example, in the above-described embodiments, in step F, the examples in which the gas containing Si as the predetermined element is used as the first process gas to form the Si-containing film such as the Si film on the wafer 200 from which the native oxide film is removed are described above. However, the present disclosure is not limited thereto. For example, in step F, a gas containing another semiconductor element may be used to form a semiconductor element-containing film on the wafer 200 from which the native oxide film is removed. For example, a gas containing germanium (Ge) as a predetermined element may be used as the first process gas to form a Ge-containing film such as a Ge film. As the gas containing Ge, for example, a monogermane ($GeH_4$) gas may be used. Further, for example, a Si-containing gas and a Ge-containing gas may be used as the first process gas to form a Si- and Ge-containing film such as a SiGe film. Further, in step F, a gas containing a metal element such as tungsten (W), molybdenum (Mo), aluminum (Al), titanium (Ti), zirconium (Zr), hafnium (Hf), or tantalum (Ta) may be used to form a metal element-containing film on the wafer 200 from which the native oxide film is removed. Even in these cases, at least one effect selected from the group of the effects described in the above-described embodiments can be obtained.

Further, in the above-described embodiments, in step F, examples in which the epitaxial film is formed on the wafer 200 are described above. However, the present disclosure is not limited thereto. For example, in addition to the single crystal film, an amorphous film, a polycrystalline film, or a mixed crystal film thereof may be formed. Even in these cases, at least one effect selected from the group of the effects described in the above-described embodiments may be obtained.

Recipes used in each process may be provided individually according to the processing contents and may be stored in the memory 121*c* via a telecommunication line or the external memory 123. Moreover, at the beginning of each process, the CPU 121*a* may properly select an appropriate recipe from the recipes stored in the memory 121*c* according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

Examples in which a film is formed by using a batch-type substrate processing apparatus capable of processing a plurality of substrates at a time are described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, examples in which a film is formed by using a substrate processing apparatus including a hot-wall-type process furnace are described in the above-described embodiments. The present disclosure is not limited to the above-described embodiments, but may be suitably applied to a case where a film is formed by using a substrate processing apparatus including a cold-wall-type process furnace.

Even in the case of using these substrate processing apparatuses, each process may be performed according to the same processing procedures and process conditions as those in the above-described embodiments and modifications, and the same effects as the above-described embodiments and modifications are achieved.

The above-described embodiments and modifications may be used in proper combination. The processing procedures and process conditions used in this case may be the same as, for example, the processing procedures and process conditions in the above-described embodiments and modifications.

According to the present disclosure in some embodiments, it is possible to sufficiently remove a native oxide film formed on the surface of a substrate.

While certain embodiments are described above, these embodiments are presented above by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) forming a modified layer by modifying at least a portion of an oxide film of the substrate by performing, a predetermined number of times:
   (a1) supplying a fluorine-containing gas to the substrate including the oxide film; and
   (a2) supplying a first reducing gas to the substrate; and
   (b) supplying the fluorine-containing gas to the substrate after the modified layer is formed,
   wherein (a) and (b) are performed in a state where a temperature of the substrate is set at a first temperature, and
   wherein the method further comprises:
   (c) sublimating the modified layer by setting the temperature of the substrate to a second temperature equal to or higher than the first temperature;
   (d) raising the temperature of the substrate from the second temperature to a third temperature;

(e) supplying a second reducing gas to the substrate in a state where the temperature of the substrate is set at the third temperature and (f) forming a predetermined element-containing film on the substrate by lowering the temperature of the substrate from the third temperature to a fourth temperature and supplying a gas containing a predetermined element to the substrate in a state where the temperature of the substrate is set at a fourth temperature wherein the fourth temperature is higher than the second temperature.

2. The method of claim 1, wherein in at least one selected from the group of (c) and (d), exhausting a space where the substrate is placed and supplying a purge gas to the space where the substrate is placed are performed alternately a predetermined number of times.

3. The method of claim 1, wherein (e) includes:

(e1) supplying the second reducing gas to the substrate in a state where a pressure of a space where the substrate is placed is set to a first pressure; and (e2) supplying the second reducing gas to the substrate in a state where the pressure of the space where the substrate is placed is set to a second pressure higher than the first pressure.

4. The method of claim 1, wherein in at least one selected from the group of (c), (d), and (e), exhausting a space where the substrate is placed and supplying at least one selected from the group of an inert gas and the second reducing gas to the space where the substrate is placed are performed alternately a predetermined number of times.

5. The method of claim 1, wherein the predetermined element includes a semiconductor element or a metal element.

6. The method of claim 1, wherein the predetermined element includes Si.

7. The method of claim 1, wherein the predetermined element-containing film includes an epitaxial film.

8. The method of claim 1, wherein supplying the first reducing gas to the substrate is not performed after performing (b).

9. The method of claim 1, wherein the first reducing gas is a nitrogen- and hydrogen-containing gas.

10. The method of claim 1, wherein the first reducing gas includes at least one selected from the group of a $NH_3$ gas, a $N_2H_2$ gas, a $N_2H_4$ gas, and a $N_3H_8$ gas.

11. The method of claim 1, wherein the second reducing gas is a nitrogen-free and hydrogen-containing gas.

12. The method of claim 1, wherein the second reducing gas includes at least one selected from the group of a $H_2$ gas and a $D_2$ gas.

13. The method of claim 1, wherein the fluorine-containing gas is a fluorine- and hydrogen-containing gas.

14. The method of claim 1, wherein the fluorine-containing gas includes at least one selected from the group of a $F_2$ gas, a $ClF_3$ gas, a $ClF$ gas, a $NF_3$ gas, and a $HF$ gas.

15. The method of claim 1, wherein a process condition in (b) is different from a process condition in (a1).

16. The method of claim 1, wherein at least one selected from the group of a supply time of the fluorine-containing gas, a supply flow rate of the fluorine-containing gas, a partial pressure of the fluorine-containing gas, a concentration of the fluorine-containing gas, and a pressure of a space where the substrate is placed is different in (b) and in (a1).

17. A method of manufacturing a semiconductor device, comprising the method of claim 1.

18. The method of claim 3, wherein the first pressure is equal to or higher than 1 Pa and equal to or less than 600 Pa, and the second pressure is equal to or higher than 700 Pa and equal to or less than 2000 Pa.

19. The method of claim 1, wherein the predetermined element-containing film includes an epitaxial Si film.

* * * * *